(12) United States Patent
Calais

(10) Patent No.: US 10,920,948 B2
(45) Date of Patent: Feb. 16, 2021

(54) AUTOMOTIVE LIGHT DEVICE WITH HIGH EFFICIENCY AND HIGH DIRECTIVITY WHITE LIGHT

(71) Applicant: Valeo North America, Inc., Troy, MI (US)

(72) Inventor: Valere Calais, Orsay (FR)

(73) Assignee: Valeo North America, Inc., Troy, MI (US)

( * ) Notice: Subject to any disclaimer, the term of this patent is extended or adjusted under 35 U.S.C. 154(b) by 0 days.

(21) Appl. No.: 16/438,047

(22) Filed: Jun. 11, 2019

(65) Prior Publication Data

US 2020/0393104 A1 Dec. 17, 2020

(51) Int. Cl.
*F21S 41/20* (2018.01)
*F21S 41/36* (2018.01)
*H01S 5/06* (2006.01)
*F21S 41/16* (2018.01)

(52) U.S. Cl.
CPC ............. *F21S 41/285* (2018.01); *F21S 41/16* (2018.01); *F21S 41/36* (2018.01); *H01S 5/0611* (2013.01)

(58) Field of Classification Search
CPC .......... F21S 41/285; F21S 41/16; F21S 41/36; H01S 5/0611
See application file for complete search history.

(56) References Cited

U.S. PATENT DOCUMENTS

| 4,021,845 A | 5/1977 | Wang | |
|---|---|---|---|
| 9,134,010 B2 * | 9/2015 | Ito | F21V 13/10 |
| 9,275,979 B2 * | 3/2016 | Tong | H01L 25/0753 |
| 2008/0030993 A1 | 2/2008 | Narendran et al. | |
| 2009/0003390 A1 | 1/2009 | Hoving | |
| 2010/0259918 A1 * | 10/2010 | Rains, Jr. | F21V 7/0025 362/84 |
| 2011/0199753 A1 * | 8/2011 | Ramer | F21K 9/00 362/84 |
| 2015/0138509 A1 * | 5/2015 | Domm | G03B 21/204 353/31 |
| 2016/0245471 A1 * | 8/2016 | Nakazato | F21S 41/16 |
| 2018/0252384 A1 * | 9/2018 | Salter | F21S 41/30 |
| 2018/0257546 A1 * | 9/2018 | Johnson | B60Q 1/48 |
| 2020/0080703 A1 * | 3/2020 | Chikama | F21S 43/195 |

FOREIGN PATENT DOCUMENTS

WO 2010/142920 A1 12/2010

* cited by examiner

*Primary Examiner* — Anabel Ton
(74) *Attorney, Agent, or Firm* — Valeo North America, Inc.

(57) ABSTRACT

A vehicle light device includes a primary light source configured to emit first light having wavelengths in a first wavelength range, and a conversion element including an input end and an output end, the input end being optically coupled to the primary light source. The conversion element includes a nonlinear optical medium configured to convert at least a portion of the first light to second light having wavelengths shifted from the first light such that the output end outputs collimated light having a broad wavelength range including wavelengths of the first light and wavelengths of the second light. An outer lens is optically coupled to the output end of the wavelength conversion element and configured to transmit the output light as white light for illuminating a path of a vehicle.

19 Claims, 4 Drawing Sheets

AUTOMOTIVE LIGHT DEVICE WITH HIGH EFFICIENCY AND HIGH DIRECTIVITY WHITE LIGHT

FIELD OF THE INVENTION

This invention relates to lighting systems, and more particularly to a vehicle light having highly directive white light.

BACKGROUND OF THE INVENTION

As is well known, vehicles contain numerous types of lighting devices. For example, exterior vehicle lighting devices that perform a stop light function, tail lamp function, head lamp function, daytime running light function, dynamic bending light function, and a fog light function are common.

In an effort to reduce traffic accidents, most governments provide safety regulations that specify vehicle lighting performance requirements. For example, Federal Motor Vehicle Safety Standards (FMVSS) No. 108 specifies the minimum photometric intensity for vehicle stop lamps (i.e. brake lights) on vehicles operated within the U.S. Vehicle manufacturers must design vehicle lighting devices to meet the technical requirements of these or similar standards around the world. In recent years, vehicle lighting has also become important for its aesthetic appeal to consumers. Thus, vehicle manufacturers have made an effort to design vehicle lighting devices in consideration of the styling of the vehicle on which the lighting devices are mounted. Further, vehicle manufacturers may provide optional lighting effects (in addition to the required lighting functionality) to enhance vehicle styling.

It is difficult to provide aesthetically appealing vehicle lighting devices that meet the required technical specifications. For example, taillights on existing cars tend to be power hungry and need various components, such as reflectors. Head lamps are similar in that they require multiple components, such as reflectors, cut off devices and the like. Aesthetic lighting effects lead to an even greater number of components and complexity. Such vehicle lighting devices are not easily adapted to the styling of the vehicle.

SUMMARY OF THE INVENTION

The disclosed invention encompasses various aspects, including the following.

Aspect (1) provides a vehicle light device, comprising a primary light source configured to emit first light having wavelengths in a first wavelength range; a conversion element comprising an input end and an output end, the input end being optically coupled to the primary light source, wherein the conversion element comprising a nonlinear optical medium configured to convert at least a portion of said first light to second light having wavelengths shifted from said first light such that the output end outputs collimated light having a broad wavelength range including wavelengths of the first light and wavelengths of the second light; and an outer lens optically coupled to the output end of said wavelength conversion element and configured to transmit said output light as white light for illuminating a path of a vehicle.

Aspect (2) provides the vehicle light device of claim 1, wherein said primary light source is a coherent light source, and said collimated light is incoherent.

Aspect (3) provides the vehicle light device of claim 1, wherein said primary light source is a laser light source, and said collimated light is incoherent.

Aspect (4) provides the vehicle light device of claim 1, wherein said primary light source is a monochromatic light source, and said collimated light is white light.

Aspect (5) provides the vehicle light device of claim 1, wherein said nonlinear optical medium provides at least one of a nonlinear frequency response, a nonlinear polarization response, and a nonlinear phase response to said first light.

Aspect (6) provides the vehicle light device of claim 1, wherein said nonlinear optical medium provides at least one of a frequency mixing effect, a Raman effect and a modulation instability effect to said first light.

Aspect (7) provides the light device of claim 6, wherein said nonlinear optical medium provides a plurality of nonlinear optical effects to create a supercontinuum light source as said collimated light.

Aspect (8) provides the light device of claim 1, wherein said non-linear optical medium comprises at least one of a barium borate (BBO) crystal and an organic dye.

Aspect (9) provides the vehicle light device of claim 1, wherein said nonlinear optical medium is an optical transmission medium.

Aspect (10) provides the light device of claim 9, wherein said nonlinear optical medium comprises a continuous optical fiber configured to provide nonlinear effects to the first light as the first light travels along the fiber.

Aspect (11) provides the light device of claim 10, wherein said continuous optical fiber is about 50 meters in length.

Aspect (12) provides the light device of claim 10, wherein said primary light source is a femtosecond laser, and said nonlinear optical medium is a Raman fiber.

Aspect (13) provides the light device of claim 1, wherein said conversion element comprises a plurality of optical components each configured to provide a different nonlinear effect, said plurality of optical components being optically coupled to one another in series.

Aspect (14) provides the light device of claim 1, wherein said conversion element comprises a plurality of quantum dot light sources dispersed in a matrix and configured to convert at least a portion of said first light to said second light.

Aspect (15) provides the light device of claim 14, wherein said primary light source comprises at least one of said plurality of quantum dot light sources and which is configured to emit light in the presence of an electric field.

Aspect (16) provides the light device of claim 15, further comprising first and second electrodes provided on opposing sides of the medium and configured to generate said electric field which causes spontaneous emission of monochromatic light from said at least one of the quantum dot light sources.

Aspect (17) provides the light device of claim 16, further comprising first and second mirrors provided on opposing sides of the medium and configured to form an optical cavity for oscillating at least said monochromatic light within said optical cavity.

Aspect (18) provides the light device of claim 17, wherein said monochromatic light causes stimulated emission of said second quantum dot light sources.

Aspect (19) provides the light device of claim 18, wherein said first mirror is highly reflective and said second mirror is partially reflective.

Aspect (20) provides the light device of claim 1, wherein said white light comprises a non-lambertian light source.

DETAILED DESCRIPTION OF SEVERAL EMBODIMENTS

Figure 1:
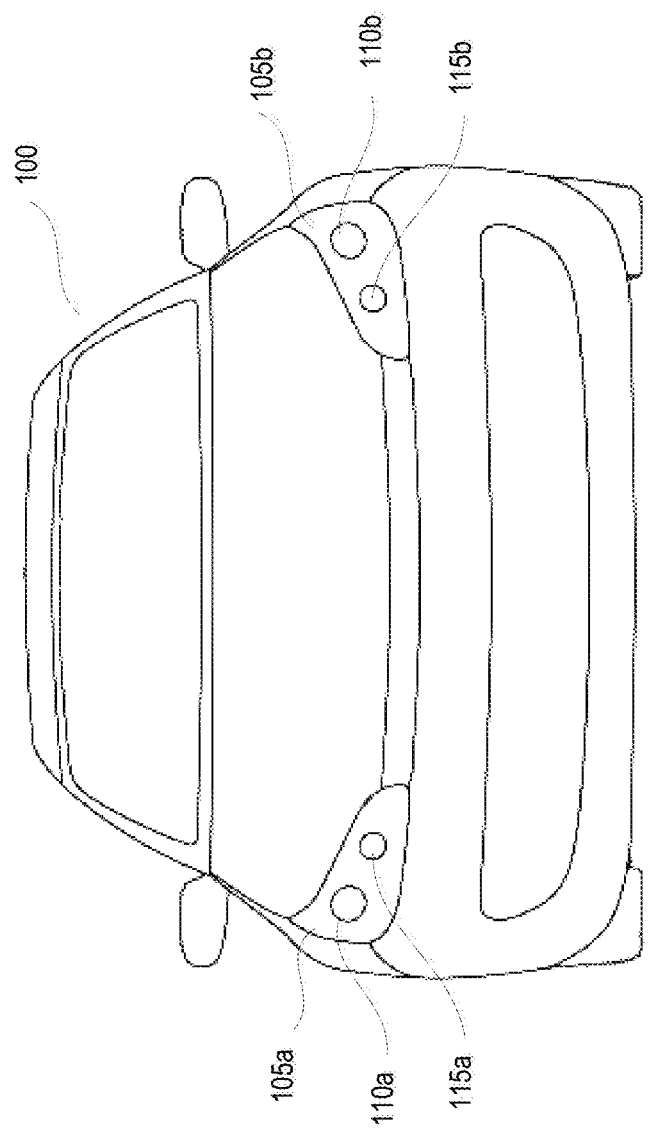
FIG. 1 illustrates a front-end of an exemplary motor vehicle in which embodiments of the disclosure may be implemented.

The present inventive concept is best described through certain embodiments thereof, which are described in detail herein with reference to the accompanying drawings, wherein like reference numerals refer to like features throughout. It is to be understood that the term invention, when used herein, is intended to connote the inventive concept underlying the embodiments described below and not merely the embodiments themselves. It is to be understood further that the general inventive concept is not limited to the illustrative embodiments described below and the following descriptions should be read in such light.

Additionally, the word exemplary is used herein to mean, "serving as an example, instance or illustration." Any embodiment of construction, process, design, technique, etc., designated herein as exemplary is not necessarily to be construed as preferred or advantageous over other such embodiments. Particular quality or fitness of the examples indicated herein as exemplary is neither intended nor should be inferred.

FIG. 1 illustrates a front-end of an exemplary motor vehicle 100. Motor vehicle 100 includes two lamp assemblies 105a and 105b, representatively referred to herein as lamp assembly(-ies) 105. Lamp assemblies 105 include low beam headlamps 110a and 110b, representatively referred to herein as low beam headlamp(s) 110, and high beam headlamps 115a and 115b, representatively referred to herein as high beam headlamp(s) 115. Low beam aspects may also be referred to as lower or dipped beam aspects and high beam aspects may also be referred to as main or driving beam aspects. Typically, the low beam headlamps 110 are used whenever another vehicle is on the road directly ahead of motor vehicle 100 and/or whenever another vehicle is approaching motor vehicle 100 from an opposite direction.

It is to be understood that while motor vehicle 100 is illustrated as a passenger automobile, the present invention is not so limited. Other motor vehicles including motorcycles, buses, trucks of all sizes, etc. may embody the present invention, as will be apparent to the skilled artisan upon review of this disclosure.

One challenge with styling automotive lighting devices is that output optics are typically large in order to provide photometric characteristics required by vehicle lighting regulations. A high luminescence light source, such as a laser light source, permits smaller sized optics. However, commercial laser sources generally cannot produce white laser light; thus laser-based vehicle light devices typically use phosphors to convert monochromatic laser light to usable white light. The present inventor has recognized that such phosphor conversion destroys the directivity and decreases the luminescence of the laser light source.

Figure 2:
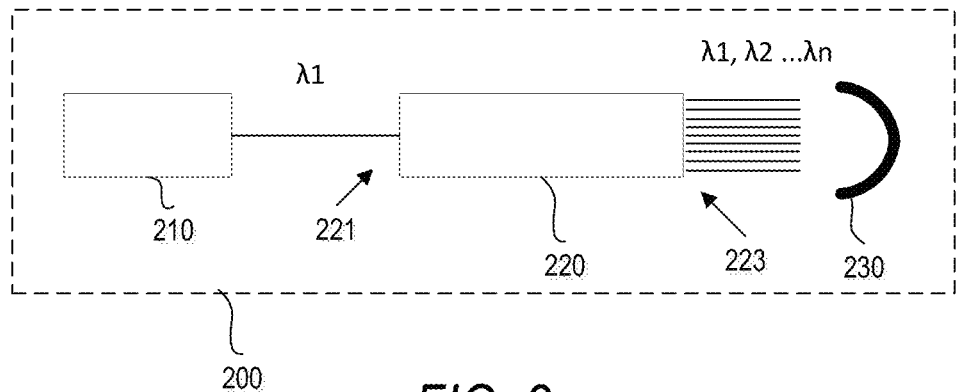
FIG. 2 is a schematic representation of a vehicle lighting device in accordance with embodiments of the present disclosure

Embodiments of the disclosed invention provide a highly collimated (directional) and efficient white source for vehicle lighting devices. FIG. 2 is a schematic representation of a vehicle lighting device in accordance with embodiments of the present disclosure. As seen, the vehicle lighting device 200 includes a primary light source 210, a wavelength conversion element 220 and an output lens 230, which may be contained in a vehicle light housing.

The primary light source 210 is configured to emit light having wavelengths in a first wavelength range, which may be a narrow bandwidth or monochromatic light as indicated by $\lambda 1$. A conversion element 220 includes an input end 221 optically coupled to the primary light source 210 and an output end 223 optically coupled to the lens 230. The conversion element 220 includes a nonlinear optical medium configured to convert at least a portion of said first light to second light $\lambda 2$ having wavelengths shifted from $\lambda 1$. The output end 223 of the conversion element outputs collimated light having a broad wavelength range including at least some wavelengths of the first light $\lambda 1$ and at least some wavelengths of the second light $\lambda 2$. Additional shifted wavelengths $\lambda n$ may also be included on the output based on the configuration of the conversion element, such that the wavelengths $\lambda 1, \lambda 2 \ldots \lambda n$ combine to provide white light. Further, unlike light emitted from phosphors, the output light $\lambda 1, \lambda 2 \ldots \lambda n$ from the conversion element 220 maintains a collimated state such that it is highly directional. The output light from the converter 220 is optically coupled to outer lens 230 which transmits the light from the vehicle light device 200 as white light for illuminating a path of a vehicle.

The primary light source 210 may provide monochromatic light, coherent light, collimated light, or a combination of these light characteristics. In one embodiment, the primary light source 210 may be a solid state light source such as a semiconductor laser for emitting monochromatic light in a narrow waveband.

The conversion element 220 includes a nonlinear optical medium that provides at least one of a nonlinear frequency response, a nonlinear polarization response, and a nonlinear phase response to the light of the primary light source 210. For example, the nonlinear medium provides at least one of a frequency mixing effect, Raman effect and modulation instability, or any other known nonlinear optical effects to the light of the primary source 210. In one embodiment, the conversion element 220 may include a barium borate (BBO) crystal, an organic dye and/or any other type of nonlinear optical material known to those skilled in the art. In some example embodiments, the nonlinear medium can provide multiple nonlinear optical effects to create a supercontinuum light source as a broad spectrum collimated white light. Where the primary light source 210 is a coherent and collimated monochromatic laser source, the nonlinear effects of the conversion element 210 reduces coherence of the laser light while maintaining substantial collimation to maintain directivity of the vehicle lighting device, as discussed further below.

The output lens 230 may be glass, plastic or any other suitable material for providing mechanical (protective) and/or optical properties for the device 200. For example, the lens 230 may be passive element that provides little or no optical effect to the output light λ1, λ2 . . . λn. However, the lens 230 may further collimate, diverge, filter, attenuate, and/or provide any other optical effect to at least a portion of the output light.

Figure 3:
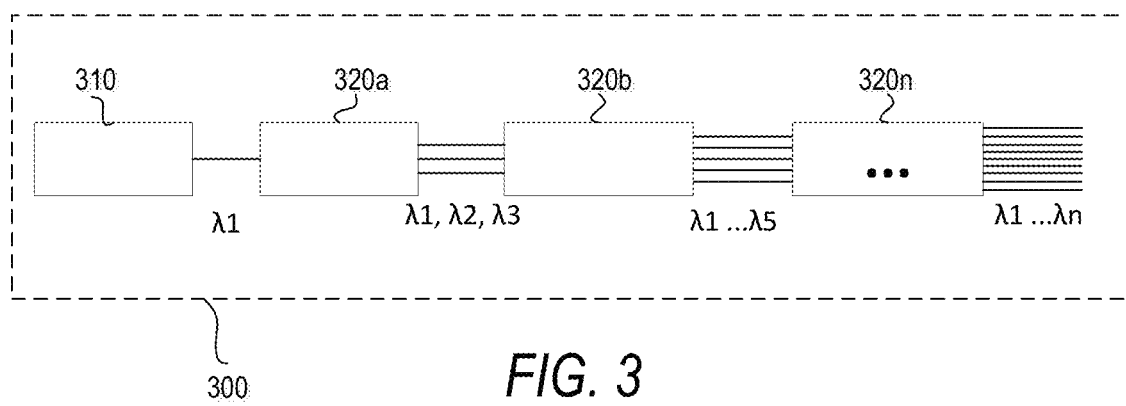
FIG. 3 is a schematic representation of a vehicle lighting device in accordance with embodiments of the present disclosure.

FIG. 3 is a schematic representation of a vehicle lighting device in accordance with an embodiment of the present disclosure. In the embodiment of FIG. 3, the vehicle light device 300 includes a laser light source 310 which provides monochromatic light having a wavelength λ1. Wavelength conversion is provided by a first nonlinear medium 320a including a BBO crystal or organic dyes which convert a part of this primary light to wavelengths λ2 and λ3. Output light from the first nonlinear medium 320a is optically coupled to a second non-linear medium 320b which includes a BBO crystal or organic dyes that convert a part of the λ1, λ2, λ3 light to provide additional shifted wavelengths λ4 and λ5. This output is optically coupled to one or more additional non-linear mediums 320n which include a BBO crystal or organic dyes that convert a part of the input light to provide additional shifted wavelengths such that the output spectrum is broadened to include many wavelengths λ1, λ2 . . . λn mix to provide white light.

Figure 4A:
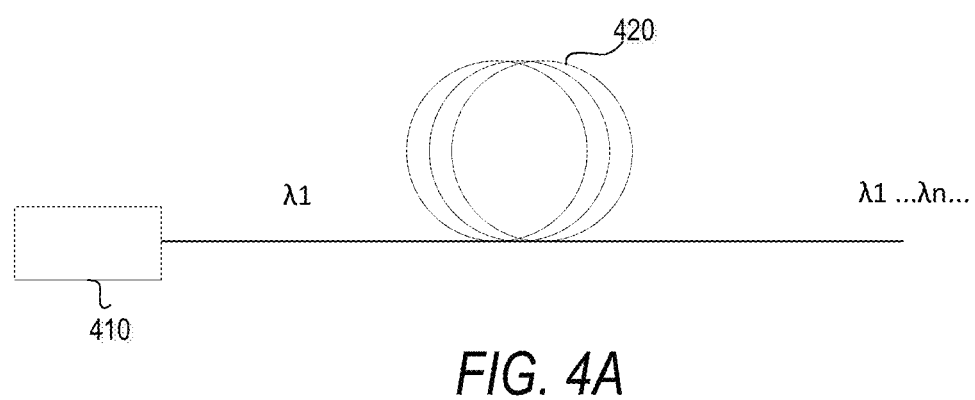
FIG. 4A is a schematic representation of a vehicle lighting device in accordance with embodiments of the present disclosure.

In some embodiments, the nonlinear medium may be a continuous optical fiber configured to provide nonlinear effects to monochromatic light as the monochromatic light travels along the fiber. FIG. 4A is a schematic representation of a vehicle lighting device in accordance with an embodiment of the present disclosure. In the embodiment of FIG. 4A, the vehicle light device 400 includes a laser light source 410 which provides monochromatic pulsed light having a wavelength λ1. In one example, the light source 410 is a femtosecond laser such as a 532 nm femtosecond laser. This light from the laser 410 is optically coupled to an optical device that allows a raman optical effect to extend the continuous spectrum from one wavelength λ1 to a spectrum that has many peaks (e.g. 10 wavelength peaks) in the visible spectrum. The conversion element 420 may be a raman fiber having an SiO2 core as the non-linear medium. In FIG. 4A, the raman fiber 420 is shown as a continuous fiber and the various output wavelengths λ1 . . . λn are not schematically depicted by lines. In one example, the continuous optical fiber is about 50 meters in length.

Figure 4B:
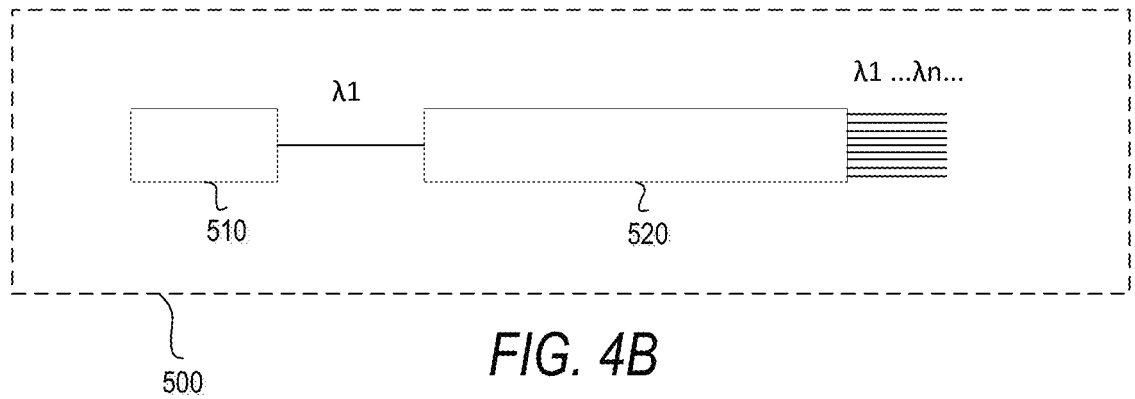
FIG. 4B is a schematic representation of a vehicle lighting device in accordance with embodiments of the present disclosure.

FIG. 4B is a schematic representation of a vehicle lighting device in accordance with yet another embodiment of the present disclosure. In the embodiment of FIG. 4B, the vehicle light device 400' includes a laser light source 410' which provides monochromatic laser light having a wavelength λ1, which is optically coupled to a conversion device 420'. The conversion device includes a nonlinear optical medium that provides a plurality of nonlinear optical effects to create a supercontinuum light source 420' providing white light λ1 . . . λn that is incoherent, but highly collimated light.

The nonlinear medium may include a plurality of optical components each configured to provide a different nonlinear effect. For example, the conversion element may include any combination of the nonlinear elements of FIGS. 2-5 to broaden the spectrum of which collimated incoherent light.

Figure 5:
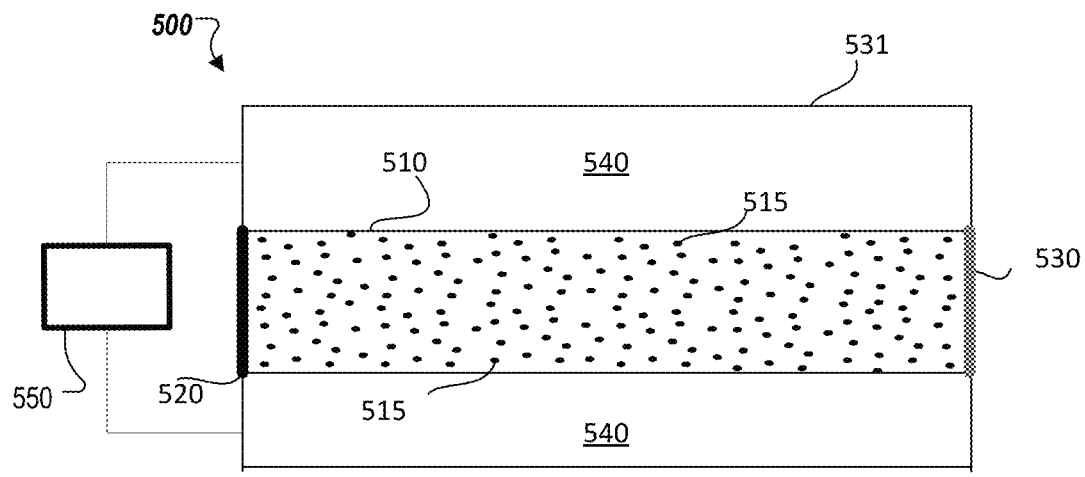
FIG. 5 is a schematic representation of a vehicle lighting device in accordance with embodiments of the present disclosure.

In another example embodiment, Quantum Dots (QD) are used within an optical cavity to emulate a gain medium of a laser to perform the spontaneous and stimulated emission. FIG. 5 provides a schematic view of a cross-section of QD light device that may be used with embodiments of the present disclosure. As seen, the device 500 includes a quantum dot portion 510, reflective end portions 520 and 530, electrodes 540 and voltage source 550. The QD portion 510 includes a plurality of QDs 515 dispersed in a surrounding material 517. The quantum dots 515 may be uniformly distributed throughout the material 517 across the layer 510 so as to absorb pump radiation incident thereon and provide homogenous light output, for example. Quantum dots such as in the layer of quantum dots 515 are well known in the art and are available from numerous sources. These quantum dots 515 may comprise various materials including semiconductors such as zinc selenide (ZnSe), cadmium selenide (CdSe), cadmium sulfide (CdS), indium arsenide (InAs), indium phosphide (InP) and/or titanium dioxide (TiO2). The size of the QDs 313 may range from about 2 to 10 nm.

As is known, since the size of these QDs 515 is so small, quantum physics governs many of the electrical and optical properties of the quantum dot 515. One such result of the application of quantum mechanics to the QD 515 is that QDs absorb a broad spectrum of optical wavelengths and re-emit radiation having a wavelength that is longer than the wavelength of the absorbed light. The wavelength of the emitted light is governed by the material composition and size of the quantum dot 515. The linewidth of the emission, i.e., full-width half-maximum (FWHM), for these semiconductor materials may range from about 20 to 30 nm. To produce this narrowband emission, quantum dots 515 simply need to absorb light having wavelengths shorter than the wavelength of the light emitted by the dots. For example, for 5.0 nm diameter CdSe quantum dots light having wavelengths shorter than about 625 nm is absorbed to produce emission at about 625 nm while for 2.2 nm quantum dots comprising CdSe light having wavelengths smaller than about 500 nm is absorbed and re-emitted at about 500 nm.

First and second electrodes 540, 530 can be provided on opposing sides of the gain medium and configured to generate an electric field which causes stimulated emission of a first quantum dot light source. The voltage source 550 provides a potential difference between the electrodes causing a current to flow through the QD layer 510, which provides energy to cause photon emission of the QDs 515. Voltage of the source 550, and/or properties of the device 500 can be varied to affect different energy delivery to the QDs to achieve a desired light output. That is, the material composition, conductivity, resistivity and or other electrical properties of the portions of the device 500 may be varied to achieve a desired result. Further, material composition and size of the QDs may be varied to achieve desired light output.

Further, first and second mirrors 520, 530 are provided on opposing sides of the gain medium 510 and configured to form an optical cavity for oscillating at least light within said optical cavity. In the embodiment of FIG. 5, the primary light source is a first quantum dot light source 515 in the cavity 510, and configured to emit monochromatic light. The gain medium includes second quantum dot light sources 515 configured to convert at least a portion of the monochromatic light to converted light. In such a device, the monochromatic light causes stimulated emission of said second quantum dot light sources 515. The size of all the types of Quantum Dot will give a broad wavelength at the output. The QDs will be maintained in an excited mode by an electric current from the voltage source 550.

Figure 6:
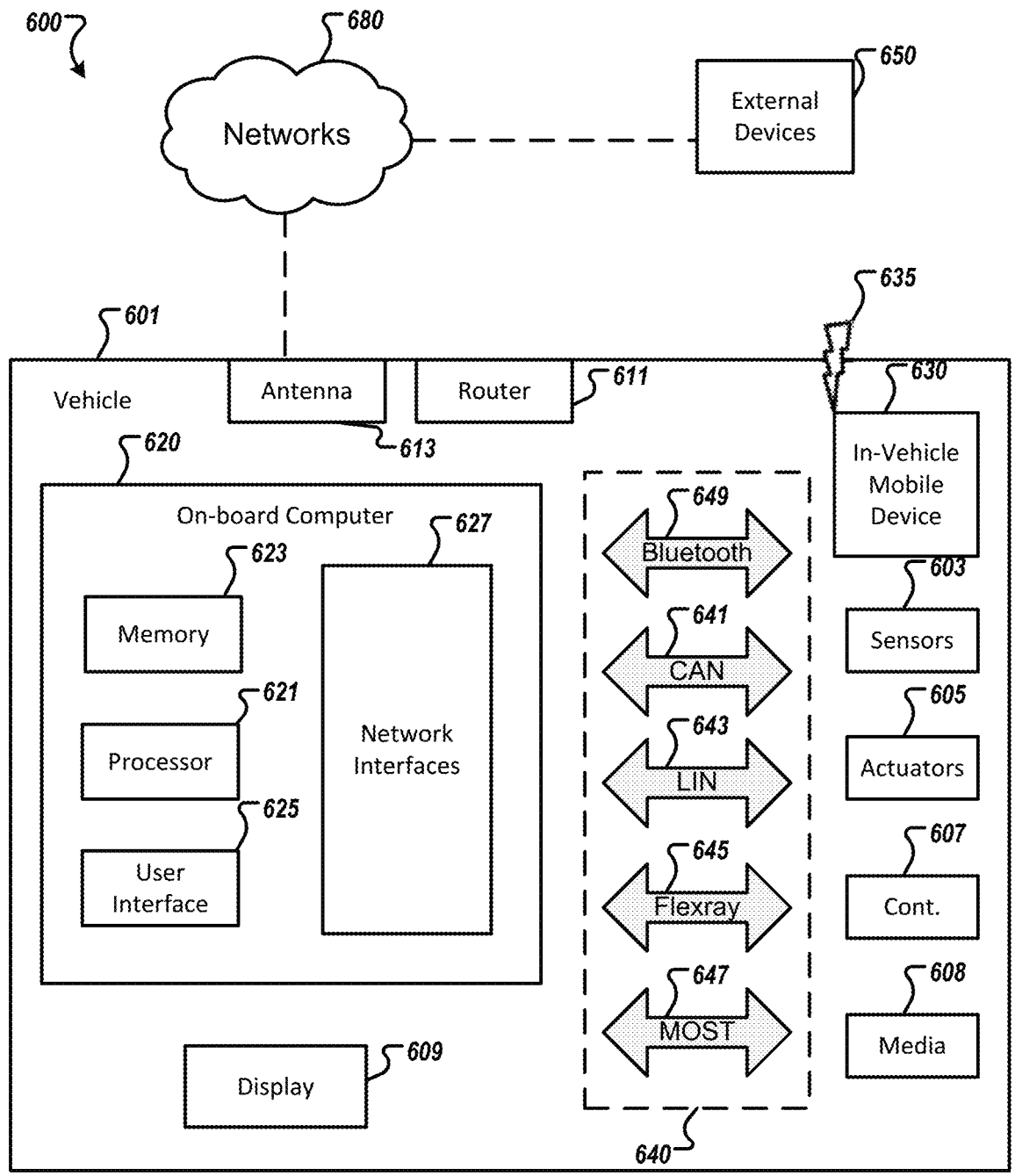
FIG. 6 is a simplified block diagram of a vehicle environment in which embodiments of the invention disclosed herein may be implemented

FIG. 6 is a simplified block diagram of a vehicle environment in which embodiments of the invention disclosed herein may be implemented. The vehicle environment 600 includes a vehicle 601 in communication with one or more external devices 650 by way of one or more external networks 680. Vehicle 601 also includes various internal networks 640 for interconnecting several vehicle devices within the vehicle as will be discussed below. The vehicle environment 600 may also include one or more in-vehicle mobile device 630. External devices 650 include any device located outside the vehicle 601 such that the external device must communicate with the vehicle and its devices by an external network 680. For example, the external devices may include mobile devices, electronic devices in networked systems (e.g., servers or clients in a local area network (LAN), etc.), on board computers of other vehicles etc. In-vehicle mobile devices 630 are devices which are located within, or in the vicinity of the vehicle 601 such that the in-vehicle mobile device can communicate directly with internal networks 640 of the vehicle 601. In-vehicle mobile devices 630 may also connect with external networks 680 as discussed below.

Vehicle 601 includes vehicle devices integral with or otherwise associated with the vehicle 601. In the embodiment of FIG. 6, vehicle devices include one or more sensors 603, one or more actuators 605, one or more control units 607, one or more media systems 608, one or more displays 609, one or more routers 611, one or more antenna 613, and one or more on board computers 620. As used herein, the term "vehicle device" is meant to encompass sensors, actuators, controllers, electronic control units (ECUs), detectors, instruments, embedded devices, media devices including speakers, a CD and/or DVD player, a radio, etc., vehicle navigation systems (e.g., GPS) displays, other peripheral or auxiliary devices or components associated with the vehicle 601.

Sensors 603 detect various conditions within (or in the immediate vicinity of) the vehicle 601. For example, sensors 603 may be temperature sensors, photosensors, position sensors, speed sensors, angle sensors or any other sensor for detecting a diagnostic condition or other parameter of the vehicle 601 or its ambient environment. Sensors 603 may be passive or "dumb" sensors that provide an analog representative of the sensed parameter, or so called "smart" sensors with integrated memory and digital processing capability to analyze the parameter sensed within the sensor itself. Actuators 605 cause motion of some mechanical element of the vehicle in response to a control signal. For example, actuators 605 may be hydraulic actuators, pneumatic actuators or electrical/electronic actuators such as a stepper motor. Actuators 605 may be used to move vehicle lighting devices to implement intelligent light, for example.

Actuators 605 may also be "dumb" devices that react to a simple analog voltage input, or "smart" devices with built-in memory and processing capability. Actuators 605 may be activated based on a sensed parameter from sensors 603, and one such sensed parameter may be a physical position of the actuator 603 itself. Thus, the sensors 603 and actuators 605 may be connected in a feedback control loop for diagnostic detection and control of the vehicle 601.

Control units 607 include any embedded system, processor, electronic control unit (ECU) or microcontroller. Control unit 607 may be dedicated to a specific region or function of the vehicle 601. For example, control unit 607 can provide memory and control logic functions for several dumb devices, such as passive sensors 603 and actuators 605. In one embodiment, control unit 607 is an ECU dedicated for controlling one or more lighting devices according to embodiments disclosed herein. Typically, numerous ECUs, with different embedded software, may be found in a single automobile and may communicate via internal networks as discussed below.

On-board computer 620 is a vehicle device for providing general purpose computing functionality within the vehicle 601. The on-board computer 620 typically handles computationally intensive functions based on software applications or "apps" loaded into memory. On-board computer 620 may also provide a common interface for different communication networks in the vehicle environment 600. On-board computer 620 includes one or more processor 621, one or more memory 623, one or more user interface 625, and one or more network interface 627. One or more display 609 and one or more router 611 may be an integral part of the on board computer 610, or distributed in the vehicle and associated with the on-board computer and other vehicle devices. Separate displays 609 may be provided in suitable locations for access by a driver and passengers in the vehicle 601.

On-board computer 620, and other associated or integrated components such as vehicle devices can include one or more memory element 623 for storing information to be used in achieving operations associated with control of light devices as disclosed herein. Further, these devices may keep information in any suitable memory element (e.g., random access memory (RAM), read only memory (ROM), field programmable gate array (FPGA), erasable programmable read only memory (EPROM), electrically erasable programmable ROM (EEPROM), etc.), software, hardware, or in any other suitable component, device, element, or object where appropriate and based on particular needs. The information being tracked, sent, received, or stored in vehicle environment 600 could be provided in any database, register, table, cache, queue, control list, or storage structure, based on particular needs and implementations, all of which could be referenced in any suitable timeframe.

In example embodiments, the operations for controlling light devices may be implemented by logic encoded in one or more tangible media, which may be inclusive of non-transitory media (e.g., embedded logic provided in an ASIC, digital signal processor (DSP) instructions, software potentially inclusive of object code and source code to be executed by a processor or other similar vehicle device, etc.). In some of these instances, one or more memory elements (e.g., memory 623) can store data used for the operations described herein. This includes the memory elements being able to store software, logic, code, or processor instructions that are executed to carry out the activities described in this Specification.

Processor 621 can execute software or algorithms to perform activities to enable control of lighting devices disclosed herein. A processor 621 can execute any type of instructions associated with the data to achieve the operations detailed herein. In one example, the activities outlined herein may be implemented with fixed logic or programmable logic (e.g., software/computer instructions executed by a processor) and the elements identified herein could be some type of a programmable processor, programmable digital logic (e.g., an FPGA, an EPROM, an EEPROM), or an ASIC that includes digital logic, software, code, electronic instructions, flash memory, optical disks, CD-ROMs, DVD ROMs, magnetic or optical cards, other types of computer-readable mediums suitable for storing electronic instructions. Any of the potential processing elements, modules, microprocessors, digital signal processors (DSPs), and other devices described herein should be construed as being encompassed within the broad term 'processor.'

Elements of FIG. 6 may be communicatively coupled to one another by one or more suitable communications medium (wired, wireless, optical) that provides a pathway for electronic communications. Any element in FIG. 6 may act as a network node in communication with any other element of FIG. 6 also acting as a network node. Any suitable network messaging protocol, network topology or network geographic scope may be included in the vehicle environment 600. Thus, embodiments of on-board computer 10 may include one or more distinct interfaces, represented by network interfaces 627, to facilitate communication via the various networks (including both internal and external networks) described herein. Such network interfaces 627 may be inclusive of multiple wireless interfaces (e.g., WiFi, WiMax, 3G, 4G, white space, 802.11x, satellite, Bluetooth, LTE, GSM/HSPA, CDMA/EVDO, DSRC, CAN, GPS, etc.). Other interfaces represented by network interfaces 26, may include physical ports (e.g., Ethernet, USB, HDMI, etc.), interfaces for wired and wireless internal subsystems, and the like. Similarly, each of the nodes of vehicle environment 600 can also include suitable interfaces for receiving, transmitting, and/or otherwise communicating data or information in the vehicle environment 600.

Multiple internal vehicle networks represented by 640 may exist in the vehicle 601 to provide communication pathways to various vehicle devices distributed throughout the vehicle 601. An internal vehicle network 640 is a collection of nodes, such as vehicle devices, integrated with or otherwise linked to the vehicle and interconnected by communication means. Vehicle networks 640 typically include hard wired bus type networks, each providing communication pathways to particular vehicle devices distributed throughout a vehicle. FIG. 6 shows four examples of such hard wired networks: Controller Area Network (CAN) 641, Local Internet Network (LIN) 643, Flexray bus 645, and Media Oriented System Transport (MOST) network 647.

CAN bus 641 uses a message based protocol, designed for and typically used by automotive applications. The CAN bus 641 is a vehicle bus standard designed to allow microcontrollers, sensors, and other devices to communicate with each other via the CAN without a host computer. CAN protocol may be used for soft real-time control of devices such as a vehicle antilock braking system. For example, CAN bus 641 may connect a transmission sensor and an energy sensor to a main engine controller, and a different CAN bus may connect the main engine controller and a main body controller to on-board computer 620. LIN network 643, may be used to sense external conditions such as light, or to control small mechanisms such as door locking systems. For example, LIN bus 643 may connect a driver's seat actuator, temperature controls, and windshield wiper actuators to a main body controller of a CAN bus.

Flexray bus 645 is typically a dedicated network for hard real-time controllers, used for drive-by-wire and/or brake-by-wire applications in which information from the engine and/or wheels of the vehicle 601 is collected and transmitted to appropriate applications and/or data repositories. For example, Flexray bus 645 may connect a chassis module of the vehicle 601 to on-board computer 620 through an appropriate interface, and/or may connect brakes and electronic stability control (ESB) to the chassis module attached to Flexray 645. MOST network 647 can also be found in vehicles for transmitting audio, video, and voice on fiber optics. MOST buses 647 can connect media system 608, to on-board computer 620 through appropriate interfaces, and/ or connect a reversing camera and a navigation system to an intermediate device which is connected to computer by MOST bus 647.

Other hard wired internal networks such as Ethernet may be used to interconnect vehicle devices in the vehicle. Further, internal wireless networks 649, such as near field communications, Bluetooth etc. may interconnect vehicle devices.

External networks and devices 650 may be accessed from vehicle 601 by vehicle devices and in-vehicle mobile devices 630 when a communication link is available. In-vehicle mobile devices 630 include mobile phones, smart mobile phones (smartphones), e-book readers, tablets, iPads, personal digital assistants (PDAs), laptops or electronic notebooks, portable navigation systems, multimedia gadgets (e.g., cameras, video and/or audio players, etc.), gaming systems, other handheld electronic devices, and any other device, component, element, or object capable of initiating voice, audio, video, media, or data exchanges within vehicle environment 600. Data, may be any type of numeric, voice, video, or script data, or any type of source or object code, or any other suitable information in any appropriate format that may be communicated from one point to another in electronic devices and/or networks. A vehicle router 611 may also be used to access external network infrastructure within range of the antenna 613 of vehicle 601.

Some form of wireless communication is needed to achieve external network connectivity from vehicle 601. For example third generation (3G), fourth generation (4G), and 3GPP long term evolution (LTE) wireless telephone technologies, worldwide interoperability for microwave access (WiMax), WiFi, and dedicated short-range communications (DSRC) are some of the numerous wireless technologies currently available with the appropriate interfaces and network infrastructure to support the technology.

Users (driver or passenger) may initiate communication in vehicle environment 600 via some network, and such communication may be initiated through any suitable device such as, in-vehicle mobile device 630, display 609, user interface 625, or external devices 650.

In-vehicle mobile devices 630, and mobile devices external to vehicle 601, may communicate with on-board computer 620 through any wireless or wired communication link and may be configured as a personal area network (PAN) or a wireless personal area network (WPAN) or any other appropriate networking architecture or system that facilitates communications in a network environment. Wired and wireless communication links may any electronic link such as Bluetooth, wireless technologies (e.g., IEEE 802.11x), a USB cable, an HDMI cable, etc. In one example, an external mobile device may be connected to computer 620 through a USB cable or wireless network when, for example, the external mobile device is a diagnostic tool used by a mechanic for servicing vehicle 10.

This invention, including all embodiments shown and described herein, could be used alone or together and/or in combination with one or more of the features covered by one or more of the claims set forth herein, including but not limited to one or more of the features or steps mentioned in the Summary of the Invention and the claims.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims. In particular, one skilled in the art will understand that the invention disclosed herein can be applied to meet could be applied in accordance with Federal Motor Vehicle Safety Standards (FMVSS) No. 108, as well as corresponding regulations in Europe, Japan, China and other parts of the world.

The invention claimed is:

1. A vehicle light device, comprising:
   a primary light source configured to emit first light having wavelengths in a first wavelength range;
   a conversion element comprising an input end and an output end, the input end being optically coupled to the primary light source, wherein the conversion element comprising a nonlinear optical medium configured to convert at least a portion of said first light to second light having wavelengths shifted from said first light such that the output end outputs collimated light having a broad wavelength range including wavelengths of the first light and wavelengths of the second light; and
   an outer lens optically coupled to the output end of said wavelength conversion element and configured to transmit said output light as white light for illuminating a path of a vehicle, wherein said nonlinear optical medium provides at least one of a nonlinear frequency response, a nonlinear polarization response, and a nonlinear phase response to said first light.

2. The vehicle light device of claim 1, wherein said primary light source is a coherent light source, and said collimated light is incoherent.

3. The vehicle light device of claim 1, wherein said primary light source is a laser light source, and said collimated light is incoherent.

4. The vehicle light device of claim 1, wherein said primary light source is a monochromatic light source, and said collimated light is white light.

5. The vehicle light device of claim 1, wherein said nonlinear optical medium provides at least one of a frequency mixing effect, a Raman effect and a modulation instability effect to said first light.

6. The light device of claim 5, wherein said nonlinear optical medium provides a plurality of nonlinear optical effects to create a supercontinuum light source as said collimated light.

7. The light device of claim 1, wherein said non-linear optical medium comprises at least one of a barium borate (BBO) crystal and an organic dye.

8. A vehicle light device, comprising:
   a primary light source configured to emit first light having wavelengths in a first wavelength range;
   a conversion element comprising an input end and an output end, the input end being optically coupled to the primary light source, wherein the conversion element comprising a nonlinear optical medium configured to convert at least a portion of said first light to second light having wavelengths shifted from said first light such that the output end outputs collimated light having a broad wavelength range including wavelengths of the first light and wavelengths of the second light; and
   an outer lens optically coupled to the output end of said wavelength conversion element and configured to transmit said output light as white light for illuminating a path of a vehicle, wherein said nonlinear optical medium is an optical transmission medium.

9. The light device of claim 8, wherein said nonlinear optical medium comprises a continuous optical fiber configured to provide nonlinear effects to the first light as the first light travels along the fiber.

10. The light device of claim 9, wherein said continuous optical fiber is about 50 meters in length.

11. The light device of claim 9, wherein said primary light source is a femtosecond laser, and said nonlinear optical medium is a Raman fiber.

12. The light device of claim 1, wherein said conversion element comprises a plurality of optical components each configured to provide a different nonlinear effect, said plurality of optical components being optically coupled to one another in series.

13. The light device of claim 1, wherein said conversion element comprises a plurality of quantum dot light sources dispersed in a matrix and configured to convert at least a portion of said first light to said second light.

14. The light device of claim 13, wherein said primary light source comprises at least one of said plurality of quantum dot light sources and which is configured to emit light in the presence of an electric field.

15. The light device of claim 14, further comprising first and second electrodes provided on opposing sides of the medium and configured to generate said electric field which causes spontaneous emission of monochromatic light from said at least one of the quantum dot light sources.

16. The light device of claim 15, further comprising first and second mirrors provided on opposing sides of the medium and configured to form an optical cavity for oscillating at least said monochromatic light within said optical cavity.

17. The light device of claim 16, wherein said monochromatic light causes stimulated emission of said second quantum dot light sources.

18. The light device of claim 17, wherein said first mirror is highly reflective and said second mirror is partially reflective.

19. A vehicle light device, comprising:
   a primary light source configured to emit first light having wavelengths in a first wavelength range;
   a conversion element comprising an input end and an output end, the input end being optically coupled to the primary light source, wherein the conversion element comprising a nonlinear optical medium configured to convert at least a portion of said first light to second light having wavelengths shifted from said first light such that the output end outputs collimated light having a broad wavelength range including wavelengths of the first light and wavelengths of the second light; and
   an outer lens optically coupled to the output end of said wavelength conversion element and configured to transmit said output light as white light for illuminating a path of a vehicle, wherein said white light comprises a non-lambertian light source.

* * * * *